United States Patent
Tylaite et al.

(10) Patent No.: US 11,776,996 B2
(45) Date of Patent: Oct. 3, 2023

(54) ESD PROTECTION DEVICE WITH ISOLATION STRUCTURE LAYOUT THAT MINIMIZES HARMONIC DISTORTION

(71) Applicant: Infineon Technologies AG, Neubiberg (DE)

(72) Inventors: Egle Tylaite, Munich (DE); Joost Adriaan Willemen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 114 days.

(21) Appl. No.: 17/536,253

(22) Filed: Nov. 29, 2021

(65) Prior Publication Data

US 2023/0170385 A1    Jun. 1, 2023

(51) Int. Cl.

| | |
|---|---|
| *H01L 29/06* | (2006.01) |
| *H01L 29/861* | (2006.01) |
| *H01L 29/74* | (2006.01) |
| *H01L 29/735* | (2006.01) |
| *H01L 29/868* | (2006.01) |

(52) U.S. Cl.
CPC ...... *H01L 29/0649* (2013.01); *H01L 29/0692* (2013.01); *H01L 29/735* (2013.01); *H01L 29/7436* (2013.01); *H01L 29/868* (2013.01); *H01L 29/8611* (2013.01)

(58) Field of Classification Search
CPC ............ H01L 29/0649; H01L 29/0692; H01L 29/735; H01L 29/7436; H01L 29/8611; H01L 29/868
See application file for complete search history.

(56) References Cited

U.S. PATENT DOCUMENTS

| | | | |
|---|---|---|---|
| 10,672,758 B2 | 6/2020 | Vendt et al. | |
| 11,011,509 B2 | 5/2021 | Zeng et al. | |
| 2009/0073621 A1* | 3/2009 | Thijs | H01L 29/861 716/119 |
| 2011/0042747 A1* | 2/2011 | Galy | H01L 29/8611 257/360 |
| 2013/0153957 A1 | 6/2013 | Lin et al. | |
| 2014/0327042 A1* | 11/2014 | Morishita | H01L 29/7436 257/173 |

(Continued)

FOREIGN PATENT DOCUMENTS

WO      2013074254 A1    5/2013

*Primary Examiner* — Shouxiang Hu
(74) *Attorney, Agent, or Firm* — Murphy, Bilak & Homiller, PLLC

(57) ABSTRACT

An ESD protection device includes a semiconductor body having an upper surface, a plurality of p-type wells that each extend from the upper surface into the semiconductor body, a plurality of n-type wells that each extend from the upper surface into the semiconductor body, first isolation regions comprising an electrical insulator that laterally surrounds the p-type wells and extends from the upper surface into the semiconductor body at least as deep as the p-type wells, and second isolation regions comprising an electrical insulator that laterally surrounds the n-type wells and extends from the upper surface into the semiconductor body at least as deep as the n-type wells, wherein the p-type wells and the n-type wells alternate with one another a first direction, and wherein an isolating area of the first isolation regions is greater than an isolating area of the second isolation regions.

18 Claims, 5 Drawing Sheets

(56) References Cited

U.S. PATENT DOCUMENTS

| | | | |
|---|---|---|---|
| 2014/0339603 A1* | 11/2014 | Kuo | H01L 27/0262 |
| | | | 257/173 |
| 2016/0343701 A1* | 11/2016 | Zhong | H01L 27/0783 |
| 2018/0108648 A1 | 4/2018 | Vendt et al. | |
| 2020/0075575 A1 | 3/2020 | Sharma | |
| 2020/0126730 A1 | 4/2020 | Puerstinger | |

* cited by examiner

ESD PROTECTION DEVICE WITH ISOLATION STRUCTURE LAYOUT THAT MINIMIZES HARMONIC DISTORTION

TECHNICAL FIELD

The instant application relates to semiconductor devices, and more particularly to electrostatic discharge protection devices.

BACKGROUND

Components such as transistors, diodes, resistors, electro-optical devices, precision film resistors and a variety of integrated circuits are all sensitive to electrostatic discharge (ESD). As electronics manufacturers drive to miniaturize devices and improve operating speeds, susceptibility of devices to ESD is increasing. For avoiding damage to integrated circuits or electronic devices by pulses during assembly or operation, ESD protection devices are connected between pins of an integrated circuit or between traces on a printed circuit board in order to prevent a malfunction or breakdown of circuits connected between the pins or traces by ESD current pulses. ESD protection devices are configured to be non-conductive at normal operational levels and become conductive in the presence of an overvoltage from an ESD event so as to divert damaging current from sensitive elements.

ESD protection devices for antenna applications should have very low capacitance and produce minimal harmonic distortions in the off-state. In bidirectional ESD protection devices used in antenna applications, harmonic distortions can substantially contribute to non-linearity. Although harmonic distortions scale proportionally with the active area of the device due to a area-dependent change of the non-linear device capacitance, reducing the active area is limited by device robustness, overshoot and clamping performance. For silicon-based ESD protection devices, it is challenging to achieve highly linear performance.

SUMMARY

Those skilled in the art will recognize additional features and advantages upon reading the following detailed description, and upon viewing the accompanying drawings.

An ESD protection device is disclosed. According to an embodiment, the ESD protection device comprises a semiconductor body comprising an upper surface, a plurality of p-type wells that each extend from the upper surface into the semiconductor body, a plurality of n-type wells that each extend from the upper surface into the semiconductor body, first isolation regions comprising an electrical insulator that laterally surrounds the p-type wells and extends from the upper surface into the semiconductor body, and second isolation regions comprising an electrical insulator that laterally surrounds the n-type wells and extends from the upper surface into the semiconductor body, wherein the p-type wells and the n-type wells alternate with one another in a first direction, and wherein an isolating area of the first isolation regions is greater than an isolating area of the second isolation regions.

Separately or in combination, each of the p-type wells and the n-type wells are spaced apart from one another in the first direction, wherein each of the p-type wells and the n-type wells have an elongated rectangle geometry, and wherein elongated sides of the p-type wells and the n-type wells run parallel to a second direction that is perpendicular to the first direction.

Separately or in combination, the first isolation regions comprise first and second elongated sections that adjoin both of the elongated sides of the p-type wells, wherein the second isolation regions comprise first and second elongated sections that adjoin both of the elongated sides of the n-type wells, and wherein a total width of the first and second elongated sections of the first isolation regions is greater than a total width of the first and second elongated sections of the second isolation regions.

Separately or in combination, the first isolation regions comprise first and second shortened sections that adjoin both end sides of the p-type wells, wherein the second isolation regions comprise first and second shortened sections that adjoin both end sides of the n-type wells, and wherein a total width of the first and second shortened sections of the first isolation regions is greater than a total width of the first and second shortened sections of the second isolation regions.

Separately or in combination, the first isolation regions are provided by a plurality of separate dielectric regions in the semiconductor body each having an outer boundary that surrounds one of the p-type wells, and wherein the second isolation regions are provided by a plurality of separate dielectric regions in the semiconductor body each having an outer boundary that surrounds one of the n-type wells.

Separately or in combination, the first isolation regions are provided by a continuous dielectric region in the semiconductor body that surrounds multiple ones of the p-type wells, and wherein the second isolation regions are provided by a plurality of separate dielectric regions in the semiconductor body each having an outer boundary that surrounds one of the n-type wells Separately or in combination, the isolating area of the first isolation region is at least 10% greater than the isolating area of the second isolation regions.

Separately or in combination, the first isolation regions and the second isolation regions are each defined by a trench formed in the upper surface, and wherein the trenches that define the first isolation regions and the second isolation regions are filled with at least one of: a dielectric material, a gas, and a vacuum.

Separately or in combination, each of the n-type wells comprise first and second shallow doped zones that form a p-n junction with one another and have a higher dopant concentration as subjacent regions of the n-type wells, wherein each of the p-type wells comprise third and fourth shallow doped zones that form a p-n junction with one another and have a higher dopant concentration as subjacent regions of the p-type wells, and wherein the ESD protection device is configured as a silicon controlled rectifier.

Separately or in combination, the ESD protection device is configured as any one of the following: a p-n diode, a p-i-n diode or an n-p-n device.

According to another embodiment, the ESD protection device comprises a semiconductor body comprising an upper surface, a plurality of p-type wells that each extend from the upper surface into the semiconductor body, a plurality of n-type wells that each extend from the upper surface into the semiconductor body, a plurality of electrical isolation regions in the semiconductor body around each of the p-type wells and each of the n-type wells, and separating semiconductor regions of semiconductor material from the semiconductor body between the n-type wells and the p-type wells, wherein the separating semiconductor regions are disposed closer to the n-type wells than the p-type wells.

Separately or in combination, each of the p-type wells and the n-type wells are spaced apart from one another in the first direction, wherein each of the p-type wells and the n-type wells have an elongated rectangle geometry, and wherein elongated sides of the p-type wells and the n-type wells run parallel to a second direction that is perpendicular to the first direction.

Separately or in combination, a distance between a first one of the elongated sidewalls from the n-type wells to the nearest interruption is less than a distance between a first one of the elongated sidewalls from the p-type wells to the nearest interruption.

Separately or in combination, a distance between a first shortened sidewall from the n-type wells to the nearest interruption is less than a distance between a first shortened sidewall from the p-type wells to the nearest interruption.

Separately or in combination, the separating semiconductor regions completely separate the electrical isolation regions surrounding the p-type wells from one another.

Separately or in combination, the first isolation regions are provided by a continuous dielectric region in the semiconductor body that surrounds multiple ones of the p-type wells, and wherein the separating semiconductor regions comprise enclosed rings of semiconductor material from the semiconductor body that surround the n-type wells.

Separately or in combination, the ESD protection device is configured as a silicon controlled rectifier.

Separately or in combination, the ESD protection device is configured as any one of the following: a p-n diode, a p-i-n diode or an n-p-n device.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates cross-sectional views of an ESD protection device, according to an embodiment. FIG. 2A illustrates the ESD protection device along a cross-section that extends in a first direction and is spaced apart from the trigger regions and FIG. 2B illustrates the ESD protection device along a cross-section that extends in the first direction and goes through the trigger regions, according to an embodiment.

DETAILED DESCRIPTION

Embodiments of a lateral ESD protection device are disclosed herein. The ESD protection device comprises a plurality of p-type wells and a plurality of n-type wells. The p-type wells and the n-type wells are arranged alternatingly with one another along a first direction of a semiconductor body. This repeating pattern of p-type and n-type wells in the semiconductor body forms the underlying structure of a device that is connected between two electrodes. The device is configured to become conductive between the two electrodes in a high voltage condition, e.g., from an ESD event, and otherwise be non-conductive between the two electrodes in an off-state of the device. The ESD protection device comprises electrical isolation regions that surround at least the p-wells and may surround the n-wells as well. The isolation area of the electrical isolation regions around the p-wells is greater than around the n-wells. That is, the total area of electrical insulator disposed between the p-wells and the adjacent semiconductor body is greater than the total area of electrical insulator disposed between the n-wells and the adjacent semiconductor body. This asymmetric isolation area configuration has advantageous benefits with respect to harmonic distortion. In particular, this area ratio can mitigate harmonic effects and improve linearity.

Figure 1:
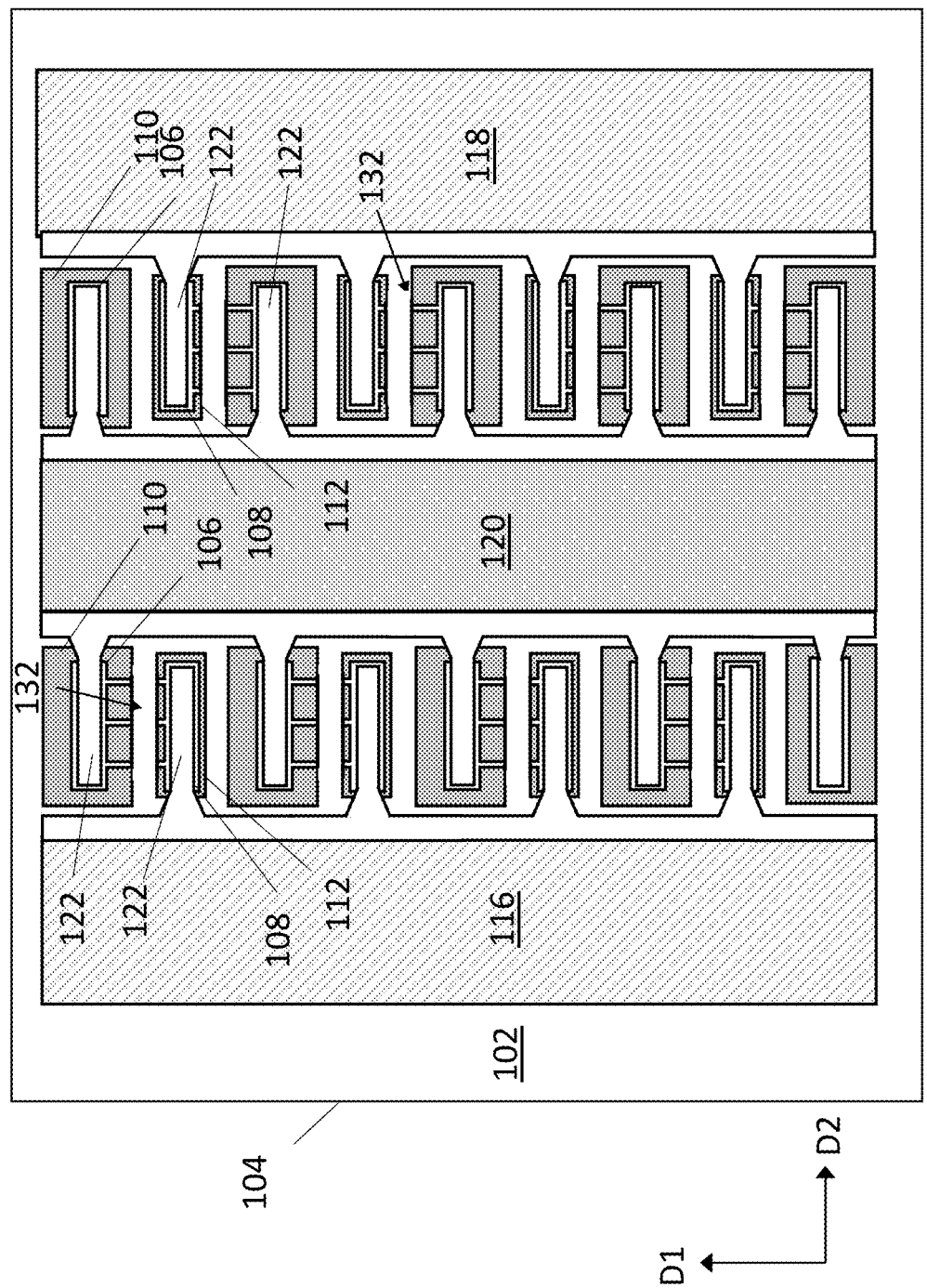
FIG. 1 illustrates a plan-view layout of an ESD protection device, according to an embodiment.

Referring to FIG. 1, an ESD protection device 100 is depicted, according to an embodiment. The ESD protection device 100 is formed in an upper surface 102 of a semiconductor body 104. Generally speaking, the semiconductor body 104 may include or consist of a semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). The ESD protection device 100 may be monolithically integrated into a semiconductor die with other active devices, e.g., transistors and in particular power switching devices, e.g., MOSFETs, IGBTs, HEMTs, etc. Alternatively, the ESD protection device 100 may be implemented as a discrete device that is configured to protect an external element though external connections, e.g., bond wire connections, PCB connections, etc.

The ESD protection device 100 comprises a plurality of p-type wells 106 that each extend from the upper surface 102 into the semiconductor body 104 and a plurality of n-type wells 108 that each extend from the upper surface 102 into the semiconductor body 104. Each of the p-type wells 106 and the n-type wells 108 can be formed by implantation of dopant atoms into the upper surface 102 into the semiconductor body 104, for example. The p-type wells 106 and the n-type wells 108 alternate with one another along a first direction D1. That is, the p-type wells 106 and the n-type wells 108 are arranged such that a cross-sectional plane extending in the first direction D1 intersects one of the p-type wells 106, followed by one of the n-type wells 108, followed by one of the p-type wells 106, and so forth.

According to an embodiment, each of the p-type wells 106 and the n-type wells 108 have an elongated rectangle geometry. An elongated rectangle geometry refers to a geometry with two elongated sides that run parallel to one another and two shorter sides that run parallel to one another and perpendicular to the elongated sides. The shorter sides of the p-type wells 106 and the n-type wells 108 may run parallel to the first direction D1. The elongated sides of the p-type wells 106 and the n-type wells 108 may run parallel to a second direction D2 that is perpendicular to the first direction D1. Moreover, the p-type wells 106 and the n-type wells 108 may have the same elongated rectangle geometry, meaning that the dimensions of each region are identical to one another. In other embodiments, the geometries of the p-type wells 106 and the n-type wells 108 may be different.

According to an embodiment, the ESD protection device 100 is configured such that a unit cell comprising, e.g., one of the p-type wells 106 and half of two of the n-type wells 108 on either side of the p-type well 106 (or vice-versa) has a fixed width, thus allowing for the provision of multiple unit cells being arranged next to one another in a regular spacing. For example, each of these unit cells may have a regular width of between 1.0 µm and 10.0 µm.

The p-type wells 106 and the n-type wells 108 can have a symmetrical layout with respect to an axis of symmetry that runs in the first direction D1 and an axis of symmetry that runs in the second direction D2. For example, in the case wherein the p-type wells 106 and the n-type wells 108 have the same elongated rectangle geometry and are regularly spaced apart from one another, a symmetrical layout with respect to both axes is realized. More generally, a symmetrical layout can be realized with different geometries. For instance, the p-type wells 106 and the n-type wells 108 can have rounded transitions instead of abrupt corners between the elongated sides and the shorter sides.

The ESD protection device 100 further comprises first isolation regions 110 and second isolation regions 112. The first isolation regions 110 comprise an electrically insulating material that surrounds the p-type wells 106. That is, the semiconductor material around the p-type wells 106 is replaced by the first isolation region 110 of electrically insulating material. The first isolation regions 110 may extend from the upper surface 102 into the semiconductor body 104 by a depth that is at least 70% of the depth of a p-n junction between the semiconductor body 104 and the one of the n-type wells 108 and the p-type wells 106 which has the opposite doping type of the semiconductor body 104, as the case may be. The depth of the first isolation region 110 may be the same as a p-n junction between the semiconductor body 104 and the one of the n-type wells 108 and the p-type wells 106 which has the same doping type of the semiconductor body 104. The second isolation regions 112 comprise an electrically insulating material that surrounds the n-type wells 108 and extends from the upper surface 102 into the semiconductor body 104 at least as deep as the p-type wells corresponding manner. Generally speaking, the electrical insulator that is provided within the first isolation regions 110 and/or the second isolation regions 112 can comprise any dielectric material or region with electrically insulating properties. Examples of these electrical insulators include oxides, nitrides, oxynitrides, and more particularly $SiO_2$ (silicon dioxide), SiN (silicon nitride), $SiO_xN_y$ (silicon oxynitride) in the case of a silicon or silicon-based semiconductor body 104. The electrical insulator can also comprise a gas, such as ambient air or a vacuum.

Figure 2:
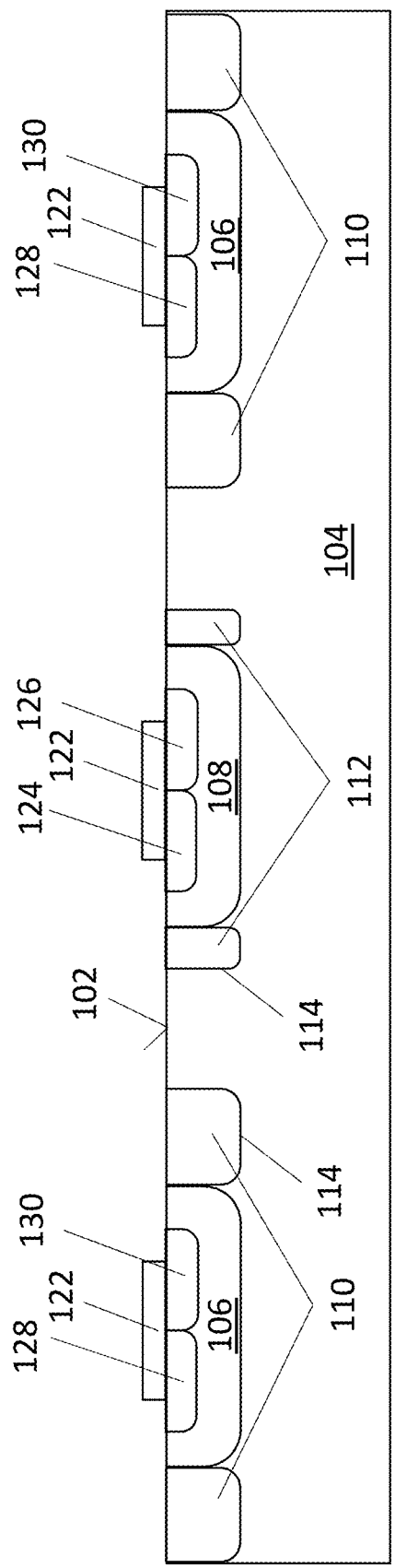
FIG. 2, which includes
Figure 2:
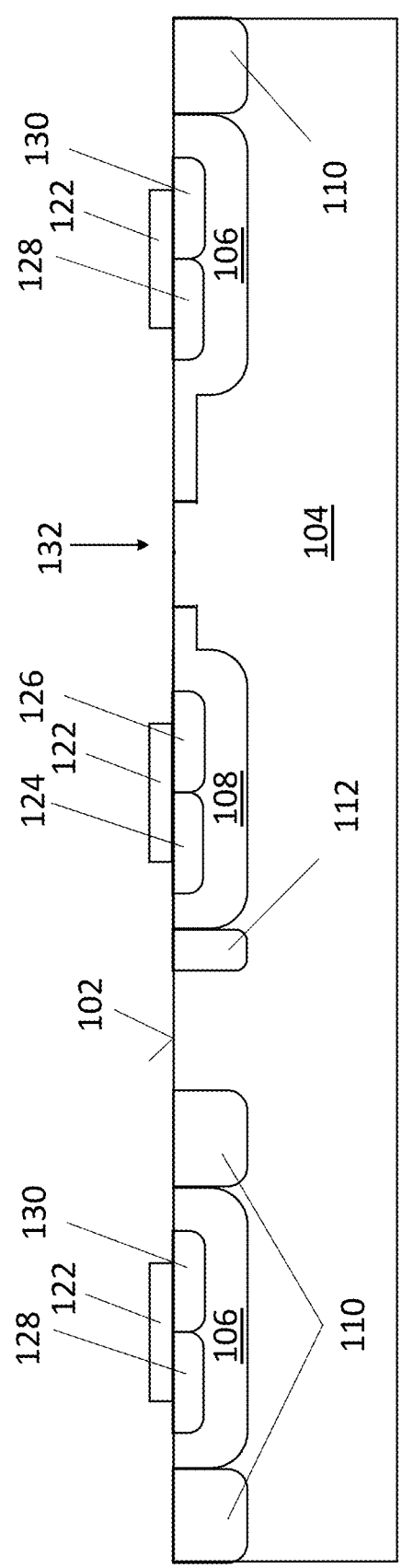

The first and second isolation regions 110, 112 can be formed from so-called shallow trench isolation (STI) regions. In that case, the first isolation regions 110 and the second isolation regions 112 are each defined by a trench 114 formed in the upper surface 102. e.g., as shown in FIG. 2. The trenches 114 that define the first isolation regions 110 and the second isolation regions 112 can be filled with a dielectric material, a gas, a vacuum or any combination thereof. For instance, the trenches 114 can be completely filed with an oxide, nitride, oxynitride, or any combination thereof. Alternatively, the sidewalls and bottom of these trenches 114 can be lined with one or more layers of oxide, nitride, oxynitride, or any combination thereof, with an open or unfilled region remaining in a central region of the trench 114. In yet another embodiment, the dielectric material which fills the trench 114 is formed to comprise cavities, i.e. closed pockets that comprise a gas or vacuum.

The ESD protection device 100 further comprises a first contact pad 116, a second contact pad 118 and a central interconnect structure 120. The first contact pad 116 is electrically connected to a first group of the n-type wells 108 by conductive runners 122 extending over and in low ohmic contact with each one of these n-type wells 108. The second contact pad 118 is electrically connected to a second group of the n-type wells 108 by conductive runners 122 extending over each one of these n-type wells 108. The central interconnect structure 120 is electrically connected to a first group of the p-type wells 106 that is adjacent to the first group of the n-type wells 108 and is connected to a second group of the p-type wells 106 that is adjacent to the second group of the n-type wells 108 by conductive runners 122 extending over each one of the p-type wells 106 in a similar manner. The first contact pad 116, the second contact pad 118 and the central interconnect structure 120 may each be formed from an electrically conductive material, e.g., copper, aluminum, nickel, and alloys thereof. The conductive runners 122 may likewise be formed from an electrically conductive material, e.g., copper, aluminum, nickel, and alloys thereof, or highly doped polysilicon.

Referring to FIG. 2, the ESD protection device 100 may comprise first and second shallow doped zones 124, 126 (omitted from FIG. 1 for simplicity) disposed within each of the n-type wells 108. The first shallow doped zones 124 form a low-ohmic contact to the subjacent n-type wells 108 and the second shallow doped zones 126 form a p-n junction with the subjacent n-type wells 108. The first and second shallow doped zones 124, 126 are each in ohmic contact with one of the conductive runners 122. The ESD protection device 100 may comprise third and fourth shallow doped zones 128, 130 (omitted from FIG. 1 for simplicity) disposed within each of the p-type wells 106. The fourth shallow doped zones 130 form a low-ohmic contact to the subjacent p-type wells 106 and the third shallow doped zones 128 form a p-n junction with the subjacent p-type wells 106.

According to an embodiment, the semiconductor body 104 has a background dopant concentration of no greater than $10^{15}$ dopant atoms/cm³ and more typically in the range of $10^{12}$ dopant atoms/cm³ to $10^{14}$ dopant atoms/cm³. The background dopant concentration of the semiconductor body 104 can be a net p-type or a net n-type concentration. The p-type wells 106 and the n-type wells 108 may be formed to have a higher net dopant concentration than the background dopant concentration of the semiconductor body 104. For example, the n-type wells 108 may have a net n-type dopant concentration of at least $10^{15}$ dopant atoms/cm³ and more typically in the range of $10^{17}$ dopant atoms/cm³. Likewise, the p-type wells 106 may have a net p-type dopant concentration of at least $10^{15}$ dopant atoms/cm³ and more typically in the range of $10^{17}$ dopant atoms/cm³. In this context, the net dopant concentration values of the p-type wells 106 and the n-type wells 108 refer to locally maximum values across a doping profile.

The p-type wells 106 and the n-type wells 108 may be formed by a first masked implantation step whereby dopant atoms are implanted into the first surface and subsequently activated, for example. The first second, third and fourth shallow doped zones 124, 126, 128, 130 may be formed to have a higher net dopant concentration than the underlying dopant concentration of the n-type wells 108 or the p-type wells 106, as the case may be. For example, the first and third shallow doped zones 124, 128 may have a net n-type dopant concentration of at least $10^{19}$ dopant atoms/cm$^3$ and more typically in the range of $10^{19}$ dopant atoms/cm$^3$ to $10^{21}$ dopant atoms/cm$^3$ and the second and fourth shallow doped zones 126, 130 may have a net p-type dopant concentration of at least $10^{19}$ dopant atoms/cm3 and more typically in the range of $10^{19}$ dopant atoms/cm$^3$ to $10^{21}$ dopant atoms/cm$^3$. In this context, the net dopant concentration values of the first, second, third and fourth shallow zones wells 124, 126, 128, 130 refer to locally maximum values across a doping profile. The first, second, third and fourth shallow zones wells 124, 126, 128, 130 may be formed by a second masked implantation step that is performed after forming the first and second doped wells 106, 108 whereby dopant atoms are implanted into the first surface and subsequently activated, for example.

The working principle of the ESD protection device 100 is as follows. The ESD protection device 100 is a lateral device, meaning that it is configured to conduct or block a current flowing parallel to the upper surface 102 of the semiconductor body 104 as between the first contact pad 116 and the second contact pad 118. The n-type wells 108 comprising the first and second shallow doped zones 124, 126 and the p-type wells 106 comprising the third and fourth shallow doped zones 128, 130 collectively form two structures connected in an anti-series configuration between the first contact pad 116 and the second contact pad 118. For positive voltages, these structures are configured as an SCR (silicon controlled rectifier) structure, i.e., a PNPN structure or thyristor. For negative voltages, these structures are configured as a forward biased p-i-n diode. As result of having these two devices arranged in an anti-series configuration, the device 100 is symmetric and bidirectional as between the first contact pad 116 and the second contact pad 118. Stated another way, the ESD protection device 100 is a bidirectional device with diodes of opposite polarity connected in series with one another. The ESD protection device 100 comprises trigger regions 132 between the pair of n-type wells 108 and the p-type wells 106 which are part of the SCR device. These trigger regions 132 are configured to create a locally reduced breakdown voltage between the p-type wells 106 and the n-type wells 108, which can place the device into a conduction state. Once the device is in the conduction state, a three dimensional current flows from the n-type wells 108 to the p-type wells 106 underneath the first and second solation regions 110, 112. Most of this three dimensional current flows in the direction from the n-wells 108 to the p-wells 106 in which the trigger regions 132 are disposed, with less current flowing in the opposite direction. This concept can be used to form a low-ohmic current path that shunts a sudden and large current, e.g., from an ESD event, away from another device that is connected to the ESD protection device 100.

Figure 3:
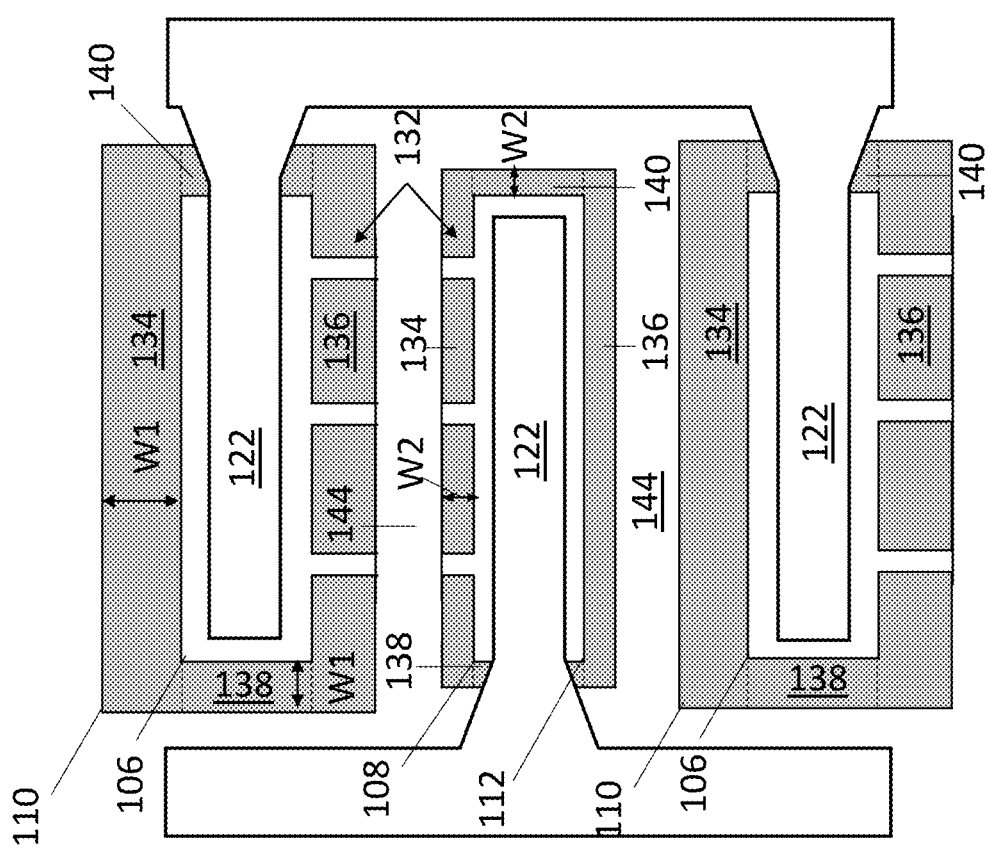
FIG. 3 illustrates a plan-view layout of a unit cell from an ESD protection device, according to an embodiment.

Referring to FIG. 3, the ESD protection device 100 is configured such that an isolating area of the first isolation regions 110 is greater than an isolating area of the second isolation regions 112. The isolating area of the first isolation regions 110 is the total area of electrical insulator that is disposed between the outer sidewalls of the p-type wells 106 and the semiconductor body 104. Likewise, the isolating area of the second isolation regions 112 is the total area of electrical insulator that is disposed between the outer sidewalls of the n-type wells 108 and the semiconductor body 104. As can be appreciated from the figures, the first isolation regions 110 and the second isolation regions 112 may completely surround the n-type wells 108 and the p-type wells 106, respectively, with the exception of the locations corresponding to the trigger regions 132. The isolating area of the first isolation regions 110 and the isolating area of the second isolation regions 112 may correspond to that of a complete enclosed ring surrounding the doped wells, e.g., a rectangular ring as shown, with the exception of these trigger regions 132.

A greater isolating area of the first isolation regions 110 in comparison to the second isolation regions 112 may be realized increasing the width W1 of at least one section of electrical insulator that adjoins one of the sidewalls of the p-type wells 106 relative to the width W2 of the corresponding section of dielectric material that adjoins the corresponding sidewall of the n-type wells 108. Stated in numerical terms, a width W1 of the dielectric material between one of the sidewalls of the p-type wells 106 and the semiconductor body 104 may be between 2.0 μm and 10.0 μm and width W2 of the dielectric material between one of the sidewalls of the n-type wells 108 and the semiconductor body 104 be less than 4.0 μm, less than 2.0 μm, less than 1.0 μm, etc. The width discrepancy can be constant or varying. For instance, the electrical insulator surrounding the p-type wells 106 can have a first fixed width W1 between 2.0 μm and 10.0 μm in every direction, and the electrical insulator surrounding the n-type wells 108 can have a second fixed width W2 that is less than the first fixed width W1 by at least 1.0 μm, at least 2.0 μm, etc., in every direction. In some embodiments, at least some of the sidewalls of the n-type wells 108 are not adjoined by any electrical insulator. That is, the n-type wells 108 directly interface with the semiconductor body 104. In one particular embodiment, the second isolation regions 112 are omitted altogether such that the device comprises only the first isolation regions 110.

In the depicted embodiment, the first isolation regions 110 comprise first and second elongated sections 134, 136 that adjoin both of the elongated sides of the p-type wells 106, and the second isolation regions 112 comprise first and second elongated sections 134, 136 that adjoin both of the elongated sides of the n-type wells 108. A total width of the first and second elongated sections 134, 136, of the first isolation regions 110, i.e., the sum of the widths W1 of both sections, can be greater than a total width of the first and second elongated sections 134, 136 of the second isolation regions 112, i.e., the sum of the widths W2 of both sections.

In the depicted embodiment, the first isolation regions 110 comprise first and second shortened sections 138, 140 that adjoin both shortened sides of the p-type wells 106, and the second isolation regions 112 comprise first and second shortened sections 138, 140 that adjoin both shortened sides of the n-type wells 108. A total width of the first and second shortened sections 138, 140 of the first isolation regions 110, i.e., the sum of the widths W1 of both sections, can be greater than the total width of the first and second shortened sections 138, 140 of the second isolation regions 112, i.e., the sum of the widths W2 of both sections.

More generally, the greater isolating area of the first isolation regions 110 in comparison to the second isolation regions 112 may be realized through any difference in geometry as between the first isolation regions 110 and the second isolation regions 112 wherein a greater area of electrical isolation material surrounds the p-type wells 106 than surrounds the n-wells 108.

Generally speaking, the isolating area of the first isolation regions 110 may be between 10 percent and 500 hundred percent greater than the isolating area of the second isolation regions 112 (if present). In one particular embodiment, the isolating area of the first isolation regions 110 is at least 50 percent greater than the isolating area of the second isolation regions 112.

In general, the presence of the first isolation regions 110 and the second isolation regions 112 improve the performance of the device by lowering the total device capacitance, in comparison to a corresponding device that does not comprise any isolation regions. However, the inventors have discovered that there is a connection between the geometry of the isolation regions and the harmonic distortion of the device. In RF applications, linearity of the device in the off-state of the device is a key performance consideration. In one example, it was observed that with an input power of 33 dBm (decibel-milliwatts) and a fundamental frequency of 900 MHz, an 8 dB improvement in third order harmonic distortion is realized, wherein the isolating area of the first isolation regions 110 was about five times greater than the isolating area of the second isolation regions 112. More generally, it is believed that any discrepancy in isolation area wherein the isolating area of the first isolation regions 110 is greater than an isolating area of the second isolation regions 112 beneficially improves linearity. With the understanding that there is a correlation between discrepancy in isolation area and harmonic distortion, the principles described herein may be utilized to determine an ideal or beneficial discrepancy in isolation area for a particular frequency range or power level. Stated another way, the discrepancy in isolation area may be varied depending on application requirements.

Figure 4:
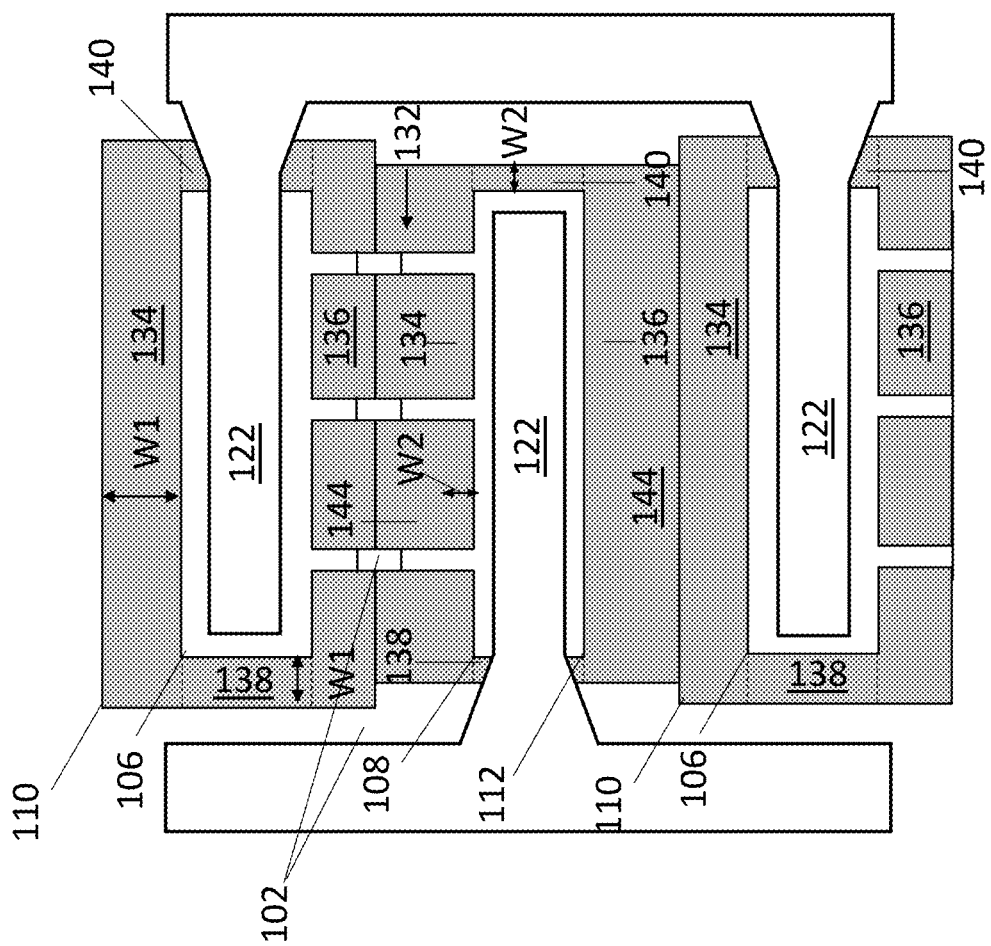
FIG. 4 illustrates a plan-view layout of a unit cell from an ESD protection device, according to an embodiment.

Referring to FIG. 4, the ESD protection device is depicted, according to another embodiment. Different to the embodiment shown in FIG. 3 wherein the alternating pairs of the first isolation regions 110 and the second isolation regions 112 are spaced apart from one another in the first direction of the semiconductor body by the separating semiconductor regions 144, in the FIG. 4 embodiment of the ESD protection device 100, the first isolation regions 110 and the second isolation regions 112 directly adjoin one another at locations between the p-type wells 106 and the n-type wells 108. In that case, the difference in isolating area as between the first and second isolation regions 110, 112 is realized at the outer ends of these structures, i.e., through differences in the widths W1, W2 of the first and second shortened sections 138, 140 as between the first and second isolation regions 110, 112.

Figure 5:
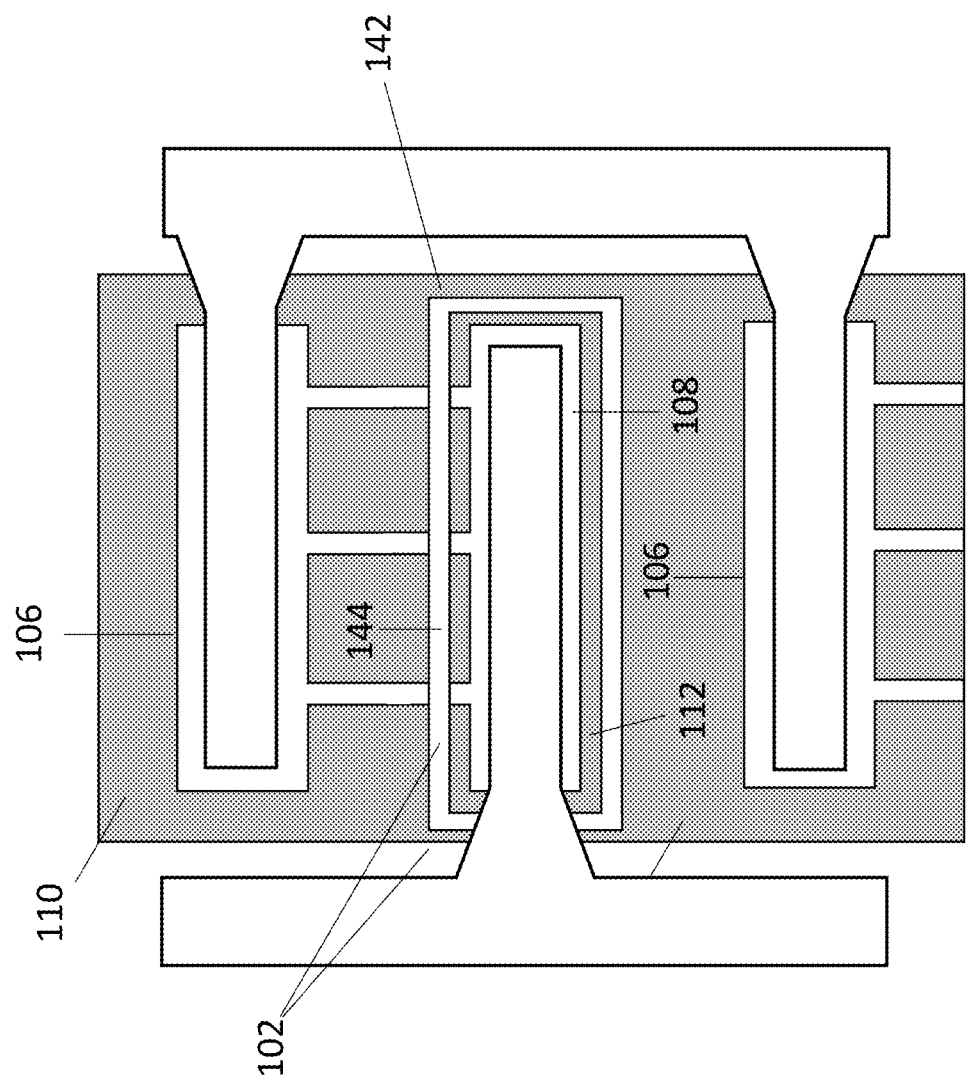
FIG. 5 illustrates a plan-view layout of a unit cell from an ESD protection device, according to an embodiment.

Referring to FIG. 5, an ESD protection device 100 that is configured such that an isolating area of the first isolation regions 110 is greater than an isolating area of the second isolation regions 112 is depicted, according to another embodiment. In this case, the device comprises a continuous dielectric region in the semiconductor body 104 that extends across the plurality of n-type wells 108 and the plurality of p-type wells 106. This continuous dielectric region provides each one of the first isolation regions 110. The second isolation regions 112 are provided by a plurality of separate dielectric regions in the semiconductor body 104 each having an outer boundary that surrounds one of the n-type wells 108. These separate dielectric regions are defined by an enclosed ring 142 of semiconductor material that surrounds the n-type wells 108 and the isolation regions 112. The enclosed ring 142 of semiconductor material is disposed closer to the n-type wells 108 than the p-type wells 106, meaning that the inward facing sidewalls of the enclosed ring 142 which face the n-type wells 108 are closer to the n-type wells 108 than the outward facing sidewalls of the enclosed ring 142 which face the p-type wells 106 are to the p-type wells 106. This concept may be used to obtain any of the isolating area discrepancies as described above through appropriate geometric configuration of the enclosed ring 142.

In any of FIGS. 3 and 5, the ESD protection device 100 comprises a plurality of electrical isolation regions in the semiconductor body 104 around each of the p-type wells 106 and each of the n-type wells 108, and separating semiconductor regions 144 of semiconductor material from the semiconductor body 104 between these electrical isolation regions. Because the geometry of the separating semiconductor regions 144 between the electrical isolation regions is an inverse pattern of the geometry of the electrical isolation regions, an area discrepancy wherein the isolating area of the first isolation regions 110 is greater than an isolating area of the second isolation regions 112 can be obtained through appropriate geometric configuration of the separating semiconductor regions 144. In the embodiment of FIG. 3, the separating semiconductor regions 144 correspond to portions of the semiconductor body 104 that are disposed between the first isolation regions 110 and the second isolation regions 112. These portions of the semiconductor body 104 disrupt the continuity of the electrical isolation regions in the first direction D1 such that the electrical isolation structures surrounding the p-type wells 106 are completely separated from one another. In the embodiment of FIG. 5, the separating semiconductor regions 144 correspond to the enclosed ring 142 of semiconductor material that surrounds the n-type wells 108. In principle, the geometry of the electrical isolation structures and the geometry of the separating semiconductor regions 144 of semiconductor material can be obtained in any way. For instance, a device with a plurality of first isolation regions 110 and a plurality of second isolation regions 112 may be formed by etching individual trenches 114 in the semiconductor body 104, wherein the separating semiconductor regions 144 correspond to unetched regions of the semiconductor body 104. Alternatively, a device with a plurality of first isolation regions 110 and a plurality of second isolation regions 112 may be formed by forming one large trench 114 in the semiconductor body 104, filling the trench 114 with a dielectric material, etching dielectric material, and regrowing semiconductor material in the etched regions of electrical isolation material, wherein the regrown semiconductor material corresponds to the separating semiconductor regions 144.

In either one of FIGS. 3 and 5, the separating semiconductor regions 144 are disposed closer to the n-type wells 108 than the p-type wells 106. That is, a separation distance between a side of the n-type wells 108 and the nearest semiconductor-dielectric interface is less than a separation distance between a corresponding side of the p-type wells 106 and the semiconductor-dielectric interface. In this context, a corresponding side refers to the same location on two shapes with the same geometry. For instance, as shown in both of FIGS. 3 and 5, the distance between a first (e.g., upper) one of the elongated sidewalls from the n-type wells 108 to the nearest sidewall of the interruption is less than a distance between a first (e.g., upper) one of the elongated sidewalls from the p-type wells 106 to the nearest sidewall of the interruption, the distance between a first (e.g., left) one of the shortened sidewalls from the n-type wells 108 to the nearest interruption is less than a distance between a first (e.g., left) one of the shortened sidewalls from the p-type wells 106 to the nearest interruption, and so forth. In both of the depicted embodiments, the separation distance between each side of the n-type wells 108 and the nearest interruption is less than a separation distance between each corresponding side of the p-type wells 106 and the nearest interruption. Thus, the isolating area of every section that adjoins the n-type wells 108 is smaller than the isolating area adjoining the p-type wells 106. More generally, the area discrepancy described herein may be obtained by making the separation distance only smaller as between one or some of the corresponding sides of the n-type wells 108 and the p-type wells 106.

While the depicted embodiments illustrate the ESD protection device 100 as a so-called silicon controlled rectifier, i.e., a p-n-p-n structure, the concepts described herein, and in particular the difference in isolation area between isolation regions, is equally applicable to other types of ESD protection devices. These other types of ESD protection devices 100 comprise p-n diodes, p-i-n diodes, and n-p-n devices (which in some embodiments can be formed as open-base bipolar transistors or as base-emitter-shorted bipolar transistors). In the case of a p-n diode or a p-i-n diode, the second and fourth shallow doped zones 126, 130 may be omitted from the device. This leaves a p-i-n structure between the first and second doped wells, wherein the underlying low-doped region of the semiconductor body 104 is essentially intrinsic or near-intrinsic and provides the intrinsic region of the p-i-n diode. For a p-n diode, the first and second doped wells may be brought into a direct p-n junction with one another at least in some regions of the semiconductor body 104. In the case of an n-p-n device, the opposite doping type shallow doped zone as the underlying doped well may be omitted from the device.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An ESD protection device, comprising:
a semiconductor body comprising an upper surface;
a plurality of p-type wells that each extend from the upper surface into the semiconductor body;
a plurality of n-type wells that each extend from the upper surface into the semiconductor body;
first isolation regions comprising an electrical insulator that laterally surrounds the p-type wells and extends from the upper surface into the semiconductor body; and
second isolation regions comprising an electrical insulator that laterally surrounds the n-type wells and extends from the upper surface into the semiconductor body,
wherein the p-type wells and the n-type wells alternate with one another in a first direction, and
wherein an isolating area of the first isolation regions is greater than an isolating area of the second isolation regions.

2. The ESD protection device of claim 1, wherein each of the p-type wells and the n-type wells are spaced apart from one another in the first direction, wherein each of the p-type wells and the n-type wells have an elongated rectangle geometry, and wherein elongated sides of the p-type wells and the n-type wells run parallel to a second direction that is perpendicular to the first direction.

3. The ESD protection device of claim 2, wherein the first isolation regions comprise first and second elongated sections that adjoin both of the elongated sides of the p-type wells, wherein the second isolation regions comprise first and second elongated sections that adjoin both of the elongated sides of the n-type wells, and wherein a total width of the first and second elongated sections of the first isolation regions is greater than a total width of the first and second elongated sections of the second isolation regions.

4. The ESD protection device of claim 2, wherein the first isolation regions comprise first and second shortened sections that adjoin both end sides of the p-type wells, wherein the second isolation regions comprise first and second shortened sections that adjoin both end sides of the n-type wells, and wherein a total width of the first and second shortened sections of the first isolation regions is greater than a total width of the first and second shortened sections of the second isolation regions.

5. The ESD protection device of claim 1, wherein the first isolation regions are provided by a plurality of separate dielectric regions in the semiconductor body each having an outer boundary that surrounds one of the p-type wells, and wherein the second isolation regions are provided by a plurality of separate dielectric regions in the semiconductor body each having an outer boundary that surrounds one of the n-type wells.

6. The ESD protection device of claim 1, wherein the first isolation regions are provided by a continuous dielectric region in the semiconductor body that surrounds multiple ones of the p-type wells, and wherein the second isolation regions are provided by a plurality of separate dielectric regions in the semiconductor body each having an outer boundary that surrounds one of the n-type wells.

7. The ESD protection device of claim 1, wherein the isolating area of the first isolation region is at least 10% greater than the isolating area of the second isolation regions.

8. The ESD protection device of claim 1, wherein the first isolation regions and the second isolation regions are each defined by a trench formed in the upper surface, and wherein the trenches that define the first isolation regions and the second isolation regions are filled with at least one of: a dielectric material, a gas, and a vacuum.

9. The ESD protection device of claim 1, wherein each of the n-type wells comprise first and second shallow doped zones that form a p-n junction with one another and have a higher dopant concentration as subjacent regions of the n-type wells, wherein each of the p-type wells comprise third and fourth shallow doped zones that form a p-n junction with one another and have a higher dopant concentration as subjacent regions of the p-type wells, and wherein the ESD protection device is configured as a silicon controlled rectifier.

10. The ESD protection device of claim 1, wherein the ESD protection device is configured as any one of the following: a p-n diode, a p-i-n diode or an n-p-n device.

11. An ESD protection device, comprising:
a semiconductor body comprising an upper surface;
a plurality of p-type wells that each extend from the upper surface into the semiconductor body;
a plurality of n-type wells that each extend from the upper surface into the semiconductor body;
a plurality of electrical isolation regions in the semiconductor body around each of the p-type wells; and
separating semiconductor regions of semiconductor material from the semiconductor body between the n-type wells and the p-type wells,
wherein the separating semiconductor regions are disposed closer to the n-type wells than the p-type wells.

12. The ESD protection device of claim 11, wherein each of the p-type wells and the n-type wells are spaced apart from one another in the first direction, wherein each of the p-type wells and the n-type wells have an elongated rectangle geometry, and wherein elongated sides of the p-type wells and the n-type wells run parallel to a second direction that is perpendicular to the first direction.

13. The ESD protection device of claim 12, wherein a distance between a first one of the elongated sidewalls from the n-type wells to the nearest interruption is less than a distance between a first one of the elongated sidewalls from the p-type wells to the nearest interruption.

14. The ESD protection device of claim 12, wherein a distance between a first shortened sidewall from the n-type wells to the nearest interruption is less than a distance between a first shortened sidewall from the p-type wells to the nearest interruption.

15. The ESD protection device of claim 12, wherein the separating semiconductor regions completely separate the electrical isolation regions surrounding the p-type wells from one another.

16. The ESD protection device of claim 12, wherein the first isolation regions are provided by a continuous dielectric region in the semiconductor body that surrounds multiple ones of the p-type wells, and wherein the separating semiconductor regions comprise enclosed rings of semiconductor material from the semiconductor body that surround the n-type wells.

17. The ESD protection device of claim 11, wherein the ESD protection device is configured as a silicon controlled rectifier.

18. The ESD protection device of claim 11, wherein the ESD protection device is configured as any one of the following: a p-n diode, a p-i-n diode or an n-p-n device.

* * * * *

UNITED STATES PATENT AND TRADEMARK OFFICE
CERTIFICATE OF CORRECTION

PATENT NO. : 11,776,996 B2
APPLICATION NO. : 17/536253
DATED : October 3, 2023
INVENTOR(S) : E. Tylaite et al.

It is certified that error appears in the above-identified patent and that said Letters Patent is hereby corrected as shown below:

On the Title Page

Abstract (Line 13), please change "another a" to -- another in a --.

Signed and Sealed this
Thirtieth Day of January, 2024

Katherine Kelly Vidal
*Director of the United States Patent and Trademark Office*